United States Patent
Shitama

[19]

[11] Patent Number: 5,841,189
[45] Date of Patent: Nov. 24, 1998

[54] SEMICONDUCTOR DEVICE AND MANUFACTURING METHOD THEREOF

[75] Inventor: Eiju Shitama, Fukuoka, Japan

[73] Assignee: Mitsubishi Denki Kabushiki Kaisha, Tokyo, Japan

[21] Appl. No.: 567,525

[22] Filed: Dec. 5, 1995

[30] Foreign Application Priority Data

May 31, 1995 [JP] Japan ..................... 7-133985

[51] Int. Cl.⁶ .......... H01L 23/02; H01L 23/12; H01L 23/48; H01J 5/00
[52] U.S. Cl. .......... 257/678; 257/704; 257/734; 257/723; 174/50; 174/50.51; 174/50.55
[58] Field of Search .............. 257/723, 678, 257/679, 685, 690, 691, 697, 704, 729, 734, 732; 174/50, 50.5, 50.51, 50.52, 50.55; 361/752

[56] References Cited

U.S. PATENT DOCUMENTS 5,038,197  8/1991  Satriano .................. 257/678
5,543,659  8/1996  Hosen ..................... 257/692
5,646,445  7/1997  Masumoto et al. ......... 257/723

FOREIGN PATENT DOCUMENTS 3-215993  9/1991  Japan .

*Primary Examiner*—Mahshid D. Saadat
*Assistant Examiner*—Jhihan B. Clark
*Attorney, Agent, or Firm*—Oblon, Spivak, McClelland, Maier & Neustadt, P.C.

[57] ABSTRACT

It is an object to enhance accuracy of intervals and parallelism between signal pins and guide pins. Guide pins (5) are integrally united to outsert cases (9) made of resin to which signal pins (3) are planted. The outsert cases (9) are fixed to a circuit board (6) and the signal pins (3) and the guide pins (5) are thus fixed to the common circuit board (6), so that the accuracy of intervals and parallelism among them is high. The circuit board (6) is accommodated in a box-like case and the opening of the case is covered with a lid (4). The guide pins (5) and the signal pins (3) pass through holes (21, 22) provided in the lid (4) and project to the outside. The guide pins (5) play a role of guiding the signal pins (3) when the signal pins (3) are coupled to an external connected body. At the same time, the guide pins (5) also serve to guide the signal pins (3) into the holes (22) when the lid (4) is mounted, so that the workability in the manufacturing process is enhanced. It has the effect that the accuracy of intervals and parallelism between the guide pins and the signal pins is high.

11 Claims, 8 Drawing Sheets

SEMICONDUCTOR DEVICE AND MANUFACTURING METHOD THEREOF

BACKGROUND OF THE INVENTION

1. Field of the Invention

The present invention relates to a semiconductor device with signal pins and guide pins projecting to the outside and a method of manufacturing the same and, particularly to improvement to increase the precision of relative positions among the signal pins and the guide pins.

2. Description of the Background Art

FIG. 12 is a perspective view showing the appearance of a conventional semiconductor device. This semiconductor device has a box-like case 11 having an opening at its one end (the upper end in FIG. 12) and a lid 81 covering the opening. The lid 81 is formed of the PBT (Poly-butylene-tele-phthalate) resin, which is a hard resin. Ends of a plurality (ten in the example of FIG. 12) of metallic signal pins 83 and two guide pins 82 project outside in parallel to one another on the surface of the lid 81. The two guide pins 82 are located on both sides of the signal pins 83.

FIG. 13 is an exploded perspective view of the device shown in FIG. 12. A boss 86 is formed on the bottom of the box-like case 11, and a circuit board 6 is attached on the boss 86. The circuit board 6 has holes 85, and the circuit board 6 is fixed on the boss 86 with screws 10 passing through the holes 85.

The circuit board 6 is further equipped with signal pins 83, which project on the upper surface of the circuit board 6, i.e., on the main surface on the opposite side to the main surface abutting on the boss 86. The lid 81 has holes 84, which the signal pins can pass through, and is fixedly equipped with guide pins 82 projecting on its upper surface, i.e., on its main surface on the side opposite to the main surface facing the circuit board 6.

The lid 81 is fixed to the upper end of the case 11 with the signal pins 83 passed through the holes 84. The case 11 and the lid 81 form an accommodation room inside, in which the circuit board 6 is accommodated.

FIG. 14 is a fragmentary sectional view of the device of FIG. 12. As shown in FIG. 14, the ten signal pins 83 are fixed to outsert cases (bases) 89, each five for each outsert case 83. The outsert case 89, which is formed of an electrically insulating resin, fixes the five signal pins 83 about their fixed ends (the ends on the side opposite to the top ends) to fixedly support the signal pins 83.

With the fixed ends of the signal pins 83 being inserted into through holes (not shown) formed in the circuit board 6 and the bottoms of the outsert cases 89 (the surfaces on which the fixed ends of the signal pins 83 are projecting) abutting on the circuit board 6, the fixed ends of the signal pins 83 are soldered to the through holes. This fixes the signal pins 83 to the circuit board 6 and the circuits developed on the circuit board 6 are electrically coupled to the signal pins 83 through the through holes.

The guide pins 82 projecting from the upper surface of the lid 81 are integrally coupled with the lid 81 and are formed of the same material as the lid 81, that is, the PBT resin.

When using the semiconductor device constituted as above, a connected body (not shown) which is electrically connectable to the signal pins 83, such as a connector, is prepared. The connected body has ten signal holes through which the signal pins 83 can be inserted and two guide holes through which the guide pins 82 can be inserted, which are separately formed, and the signal pins 83 and the guide pins 82 are individually inserted into these holes so as to realize electrical connection between the signal pins 83 and the connected body.

As shown in FIG. 14, the guide pins 82 project longer than the signal pins 83. Accordingly, when coupling the connected body and the signal pins 83 together, the guide pins 82 are inserted into the guide holes first. As a result, the ends of the signal pins 83 are guided into the signal holes and then insertion of the signal pins 83 into the signal holes can be made easily. That is to say, the guide pins 82 serve as a guiding member for guiding the signal pins 83 to predetermined positions on the connected body.

The conventional semiconductor device, structured as described above, had such problems as below. First, since the guide pins 82 are formed of the PBT resin which is the same as the lid 81, they do not have enough strength to an external impact, producing a problem of easy breakage. Especially, in use of the device, when attaching/detaching the signal pins 83 to/from the connected body, an imprudent transverse force may often be exerted to the guide pins 82 by a man's mistake. Then it will frequently cause accidents of breakage of the guide pins 82.

Further, in the process of manufacturing the device, in the final process of attaching the lid 81 to the opening of the case 11, the top ends of the signal pins 83 must be passed through the holes 84 provided in the lid 81. In the conventional device, however, it has been attended with difficulties to insert the top ends of the signal pins 83 into the holes 84 because the device has no member for guiding the top ends of the signal pins 83 into the holes 84 formed in the lid 81. That is to say, the workability of the final process was not good and the fabrication needed extra labor and cost.

Further, in the conventional device, the signal pins 83 are fixed to the circuit board 6 while the guide pins 82 are coupled to the lid 81. That is to say, the signal pins 83 and the guide pins 82 are fixed to different members. Accordingly, when the circuit board 6 and the lid 81 are respectively fixed to the case 11 and the device is completed, intervals and parallelism among the signal pins 83 and the guide pins are not always accurately obtained. If the intervals and the parallelism are not obtained accurately, then it will be difficult to smoothly couple the signal pins 83 and the connected body.

SUMMARY OF THE INVENTION

A first aspect of the present invention is directed to a semiconductor device in which a plurality of guide pins and electroconductive at least one signal pin project to the outside in parallel to one another. According to the present invention, the semiconductor device comprises: a box-like case having an opening at one end; a lid which covers the opening; and a circuit board fixed to the case and accommodated in an accommodation room formed inside with the case and the lid, the plurality of guide pins and the at least one signal pin being fixed to the circuit board and passing through the lid to project to the outside.

Preferably, according to the semiconductor device of a second aspect of the present invention, the plurality of guide pins project to the outside longer than the at least one signal pin.

Preferably, according to the semiconductor device according to a third aspect of the present invention, the lid and the case are formed of electrically insulating resin, and the plurality of guide pins are formed of resin with toughness higher than that of any of the lid and the case.

Preferably, according to the semiconductor device according to a fourth aspect of the present invention, the lid has first through holes of the same number as the plurality of guide pins through which the plurality of guide pins individually pass and a second through hole of the same number as the at least one signal pin through which the at least one signal pin individually passes, and play of the second through hole with respect to the at least one signal pin is larger than play of the first through holes with respect to the plurality of guide pins.

Preferably, the semiconductor device according to a fifth aspect of the present invention further comprises electrically insulating at least one base to which the plurality of guide pins are fixed and the at least one signal pin is planted, wherein at least a part of the plurality of guide pins are fixed to, and at least a part of the at least one signal pin is planted to each of the at least one base, and the at least one base is fixed to the circuit board.

Preferably, according to the semiconductor device according to a sixth aspect of the present invention, the base has a flat abutting plane and the base is fixed to the circuit board with the abutting plane abutting on a main surface of the circuit board.

Preferably, according to the semiconductor device according to a seventh aspect of the present invention, the plurality of guide pins and the at least one base are both formed of resin, and each of the at least one base is integrally united with the at least a part of the plurality of guide pins fixed to the each.

Preferably, according to the semiconductor device according to an eighth aspect of the present invention, the at least one base is formed of resin, and the plurality of guide pins are formed of resin having toughness higher than that of the at least one base.

Preferably, according to the semiconductor device according to a ninth aspect of the present invention, at least two of the plurality of guide pins are positioned on both sides of the at least one signal pin interposed therebetween.

Preferably, according to the semiconductor device according to a tenth aspect of the present invention, the plurality of guide pins are three or more in number and the three or more guide pins are positioned to enclose the at least one signal pin.

Preferably, according to the semiconductor device according to an eleventh aspect of the present invention, the circuit board has first through holes of the same number as the plurality of guide pins into which the plurality of guide pins are individually inserted and a second through hole of the same number as the at least one signal pin into which the at least one signal pin is individually inserted, the plurality of guide pins have first stop members which are incapable of passing through the first through holes provided at their one ends on the side opposite to the side projecting to the outside, the at least one signal pin has a second stop member which is incapable of passing through the second through hole provided on its one end on the side opposite to the side projecting to the outside, the plurality of guide pins are fixedly supported in the first through holes with the first stop members abutting on rims of the first through holes, and the at least one signal pin is fixedly supported in the second through hole with the second stop member abutting on a rim of the second through hole.

A twelfth aspect of the present invention is directed to a method of manufacturing a semiconductor device in which a plurality of guide pins and electroconductive at least one signal pin project to the outside in parallel to one another. According to the invention, the method comprises the steps of: (a) preparing a box-like case having an opening at one end; (b) preparing a lid which can be attached to the case so as to cover the opening; (c) preparing a circuit board which can be accommodated in an accommodation room formed inside with the case and the lid attached; (d) forming in the lid first through holes of the same number as the plurality of guide pins through which the plurality of guide pins can individually pass and a second through hole of the same number as the at least one signal pin through which the at least one signal pin can individually pass; (e) fixing the plurality of guide pins and the at least one signal pin to the circuit board so that the plurality of guide pins can be inserted into the first through holes before the at least one signal pin is inserted into the second through hole; (f) fixing the circuit board inside the case so that the plurality of guide pins and the at least one signal pin project to the outside of the opening; (g) individually passing the plurality of guide pins through the first through holes; (h) after the step (g), individually passing the at least one signal pin into the second through hole; and (i) after the step (h), attaching the lid to the case so as to cover the opening.

Preferably, according to the manufacturing method according to a thirteenth aspect of the present invention, the step (b) comprises the step (b-1) of preparing as the lid a member like a flat plate which can be attached to the case so as to cover the opening, and the step (e) comprises the step (e-1) of fixing the plurality of guide pins and the at least one signal pin to the circuit board so that the plurality of guide pins project longer than the at least one signal pin.

Preferably, the manufacturing method according to a fourteenth aspect of the present invention further comprises the step (j) of preparing electrically insulating at least one base to which the plurality of guide pins are fixed and the at least one signal pin is planted, at least a part of the plurality of guide pins being fixed to, and at least a part of the at least one signal pin being planted to each of the at least one base, and the step (e) comprising the step (e-1) of fixing the at least one base to the circuit board.

According to the device of the first aspect, since the signal pin and the guide pins are both fixed to the circuit board, high accuracy is obtained in the intervals and parallelism among the signal pin and the guide pins. Accordingly, when using the device, the signal pin can be smoothly connected to a connected body while utilizing the guide pins as a guide. The guide pins can also be utilized as a guide for passing through the signal pin when attaching the lid to cover the opening of the case. That is to say, the workability in the manufacturing process of the device is also improved.

According to the device of the second aspect, since the guide pins project to the outside longer than the signal pin, the guide pins can serve to guide the signal pin when it is coupled to a connected body having the most general structure in which holes for insertion of the guide pins and a hole for insertion of the signal pin are formed in the same flat plane. Similarly, when attaching a lid like a flat plate, which is the most general shape, the guide pins serve to guide the signal pin, too. That is to say, a connected body and a lid with the most general forms can be used.

According to the device of the third aspect, since the guide pins which are prone to breakage by a careless transverse force etc. exerted when making connection with a connected body are formed of resin with toughness higher than the lid and the case which are relatively free from breakage, breakage of the guide pins can be prevented without unnecessarily increasing the cost of the device.

According to the device of the fourth aspect, the first and second through holes through which the guide pins and the signal pin individually pass are respectively formed in the lid, and the play for the signal pin is larger than the play for the guide pins. Accordingly, by inserting the guide pins into the first through holes first, the signal pin can be inserted into the second through hole certainly and smoothly without having the signal pin abut on the rim of the second through hole. That is to say, the workability when attaching the lid is increased.

According to the device of the fifth aspect, the device is provided with at least one base to which at least one guide pin is fixed and at least one signal pin is planted, and this at least base is fixed to the circuit board. Accordingly, by fixing the base to the circuit board, a plurality of parts including the guide pins and the signal pin are fixed to the circuit board at the same time, and thus the workability in the process of manufacturing the device is enhanced.

According to the device of the sixth aspect, since the base has a flat abutting plane which abuts on the circuit board, the signal pin and the guide pins can easily be fixed so that they face in a predetermined direction with respect of the circuit board by making the abutting plane abut on the main surface of the circuit board. Accordingly, parallelism among the guide pins and the signal pin can be obtained accurately and easily.

According to the device of the seventh aspect, since the base and the guide pin are formed of resin and the guide pin and the base fixed to each other are united integrally to each other, the guide pin and the base can be formed at the same time using a single mold. That is to say, the guide pin and the base can be manufactured easily.

According to the device of the eighth aspect, since the guide pins which are prone to breakage by a careless transverse force etc. exerted when coupled to a connected body are formed of resin with toughness higher than that of the base which has a relatively low possibility of breakage, breakage of the guide pins can be prevented without unnecessarily increasing the cost of the device.

According to the device of the ninth aspect, as at least two of the plurality of guide pins are positioned on both sides of the signal pins interposed therebetween, the signal pin is guided by the guide pins with high positional accuracy.

According to the device of the tenth aspect, as three or more guide pins are located to enclose the signal pin, the signal pin is guided by the guide pins with a high positional accuracy.

According to the device of the eleventh aspect, the guide pins and the signal pin are inserted into the through holes provided in the circuit board so as to be directly fixed to the circuit board. The respective pins have stop members, and they are fixed with the stop members abutting on rims of the through holes. Accordingly, the lengths of projections of the respective pins are accurately determined to predetermined lengths.

According to the manufacturing method of the twelfth aspect, the first and second through holes through which the respective guide pins and the respective signal pins can pass are previously formed in the lid. Then, after the guide pins and the signal pins are fixed to the circuit board, the circuit board is fixed. Subsequently, the lid is attached by passing the guide pins and the signal pins through the first and second through holes, respectively. Since the guide pins and the signal pins are fixed to the circuit board so that the guide pins can be inserted into the first through holes before the signal pins are inserted into the second through holes, the guide pins are first inserted into the first through holes when attaching the lid.

As the plurality of guide pins are provided, inserting the guide pins into the first through holes determines the relative position between the lid and the circuit board. That is to say, the relative position between the signal pins and the second through holes is determined to predetermined positional relation. As a result, the following step of inserting the signal pins into the second through holes can be made easily.

As stated above, in this manufacturing method, the guide pins function as a guiding member for guiding the signal pins into the second through holes formed in the lid. Accordingly, the efficiency in the manufacturing process is enhanced and labor and cost required in production are saved.

According to the device of the thirteenth aspect, the guide pins and the signal pin are fixed to the circuit board so that the guide pins project longer than the signal pin, so that it is sufficient to prepare a lid like a flat plate, which is the most simple and general, without necessity of preparing a lid with a complicated shape in utilizing the guide pins as a guiding member when attaching the lid. That is to say, the step of preparing a lid is simplified and efficiency of production is enhanced.

According to the manufacturing method of the fourteenth aspect, a base to which at least one guide pin is fixed and at least one signal pin is planted is prepared in advance and the guide pin and the signal pin are fixed to the circuit board by attaching this base to the circuit board. That is to say, a plurality of parts including the guide pin and the signal pin are fixed to the circuit board at the same time. Accordingly, efficiency in the manufacturing process is further enhanced and labor required in production is further saved.

The present invention has been made to solve such problems of the conventional device as described earlier, and it is an object of the present invention to obtain a semiconductor device which provides prevention of breakage of guide pins, increased workability in the manufacturing process, and high accuracy of intervals and parallelism among the signal pins and the guide pins, and also to present a method suitable for manufacturing this semiconductor device.

These and other objects, features, aspects and advantages of the present invention will become more apparent from the following detailed description of the present invention when taken in conjunction with the accompanying drawings.

BRIEF DESCRIPTIONS OF THE DRAWINGS

Figure 4A:
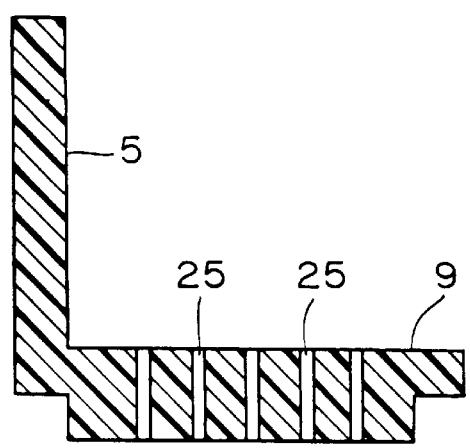
Figure 4B:
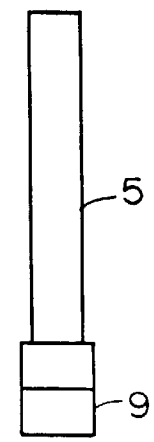
Figure 4C:
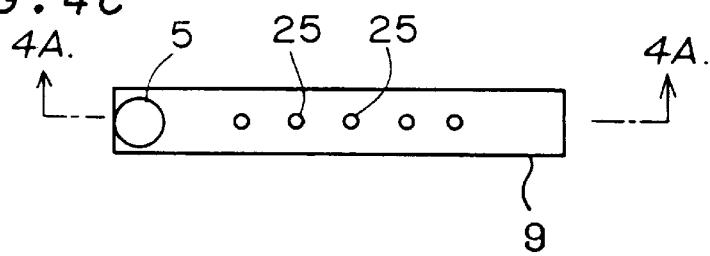

FIGS. 4A, 4B, and 4C are a three-side view of the outsert case of the first preferred embodiment.

Figure 5:
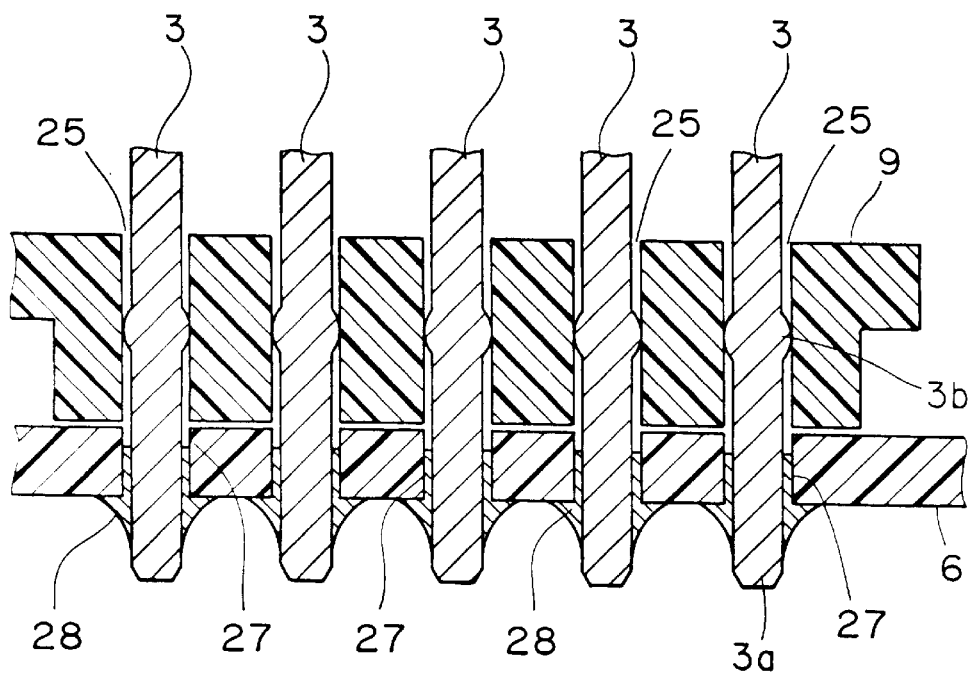

FIG. 5 is an enlarged sectional view of a part of the device of the first preferred embodiment.

Figure 6:
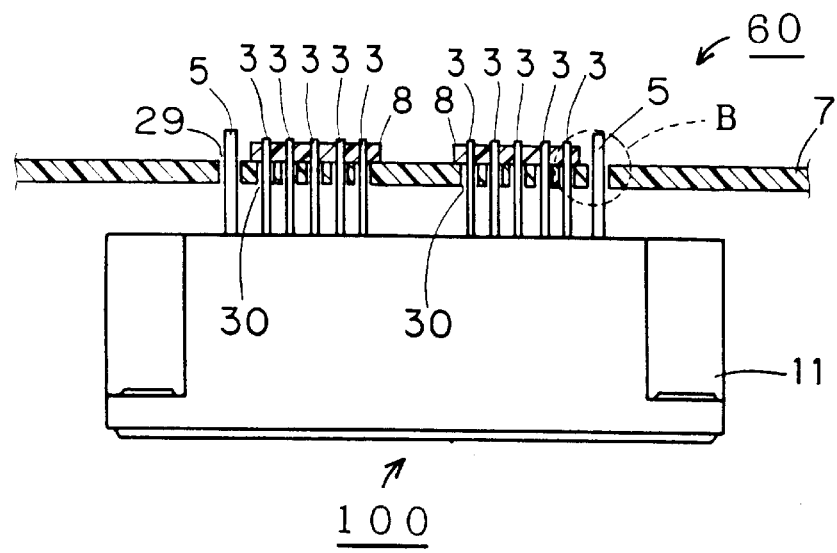

FIG. 6 is a fragmentary sectional front view of the device and the connected body of the first preferred embodiment.

Figure 7:
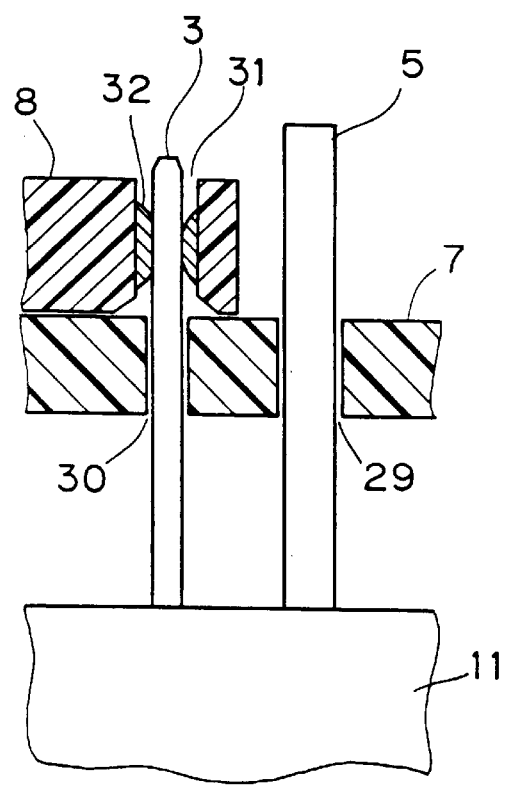

FIG. 7 is an enlarged view of the part of the letter B in FIG. 6.

Figure 8:
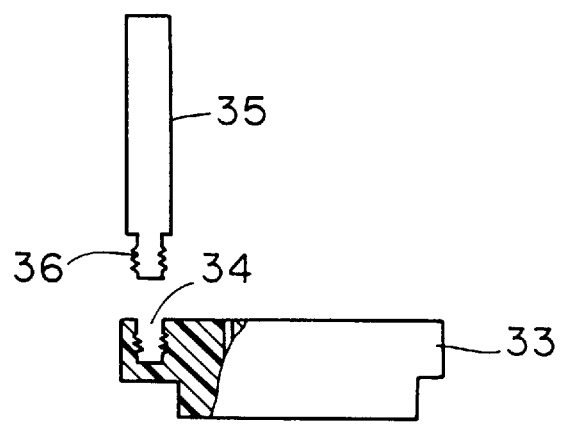

FIG. 8 is a fragmentary sectional view of one example of an outsert case of a second preferred embodiment.

Figure 9:
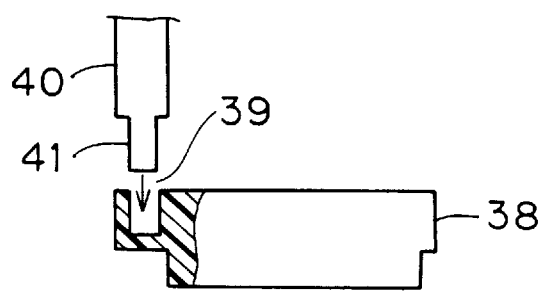

FIG. 9 is a fragmentary sectional view of another example of the outsert case of the second preferred embodiment.

Figure 10:
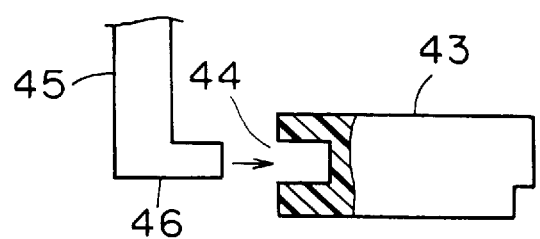

FIG. 10 is a fragmentary sectional view of still another example of the outsert case of the second preferred embodiment.

Figure 11:
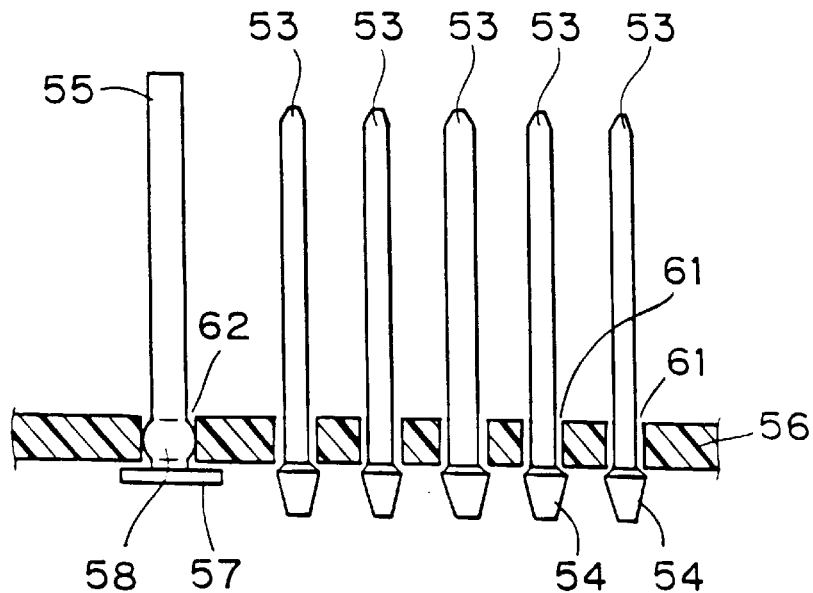

FIG. 11 is a sectional view of a part of a device of a third preferred embodiment.

Figure 12:
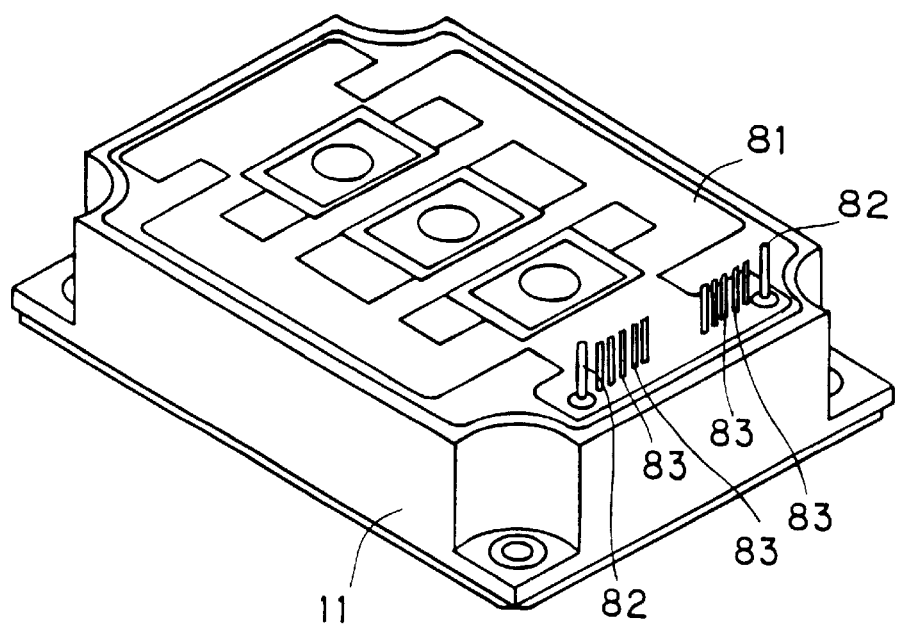

FIG. 12 is a general perspective view of a conventional device.

Figure 13:
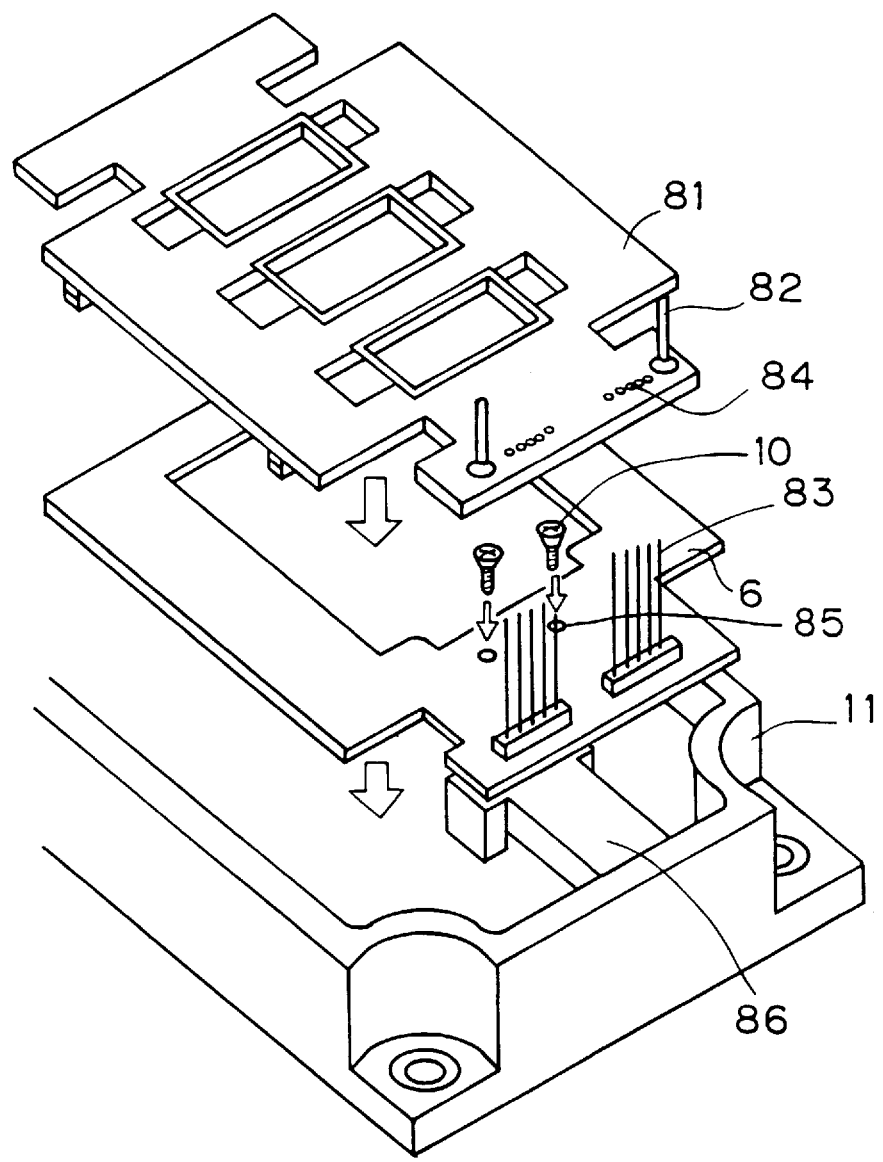

FIG. 13 is an exploded perspective view of the conventional device.

Figure 14:
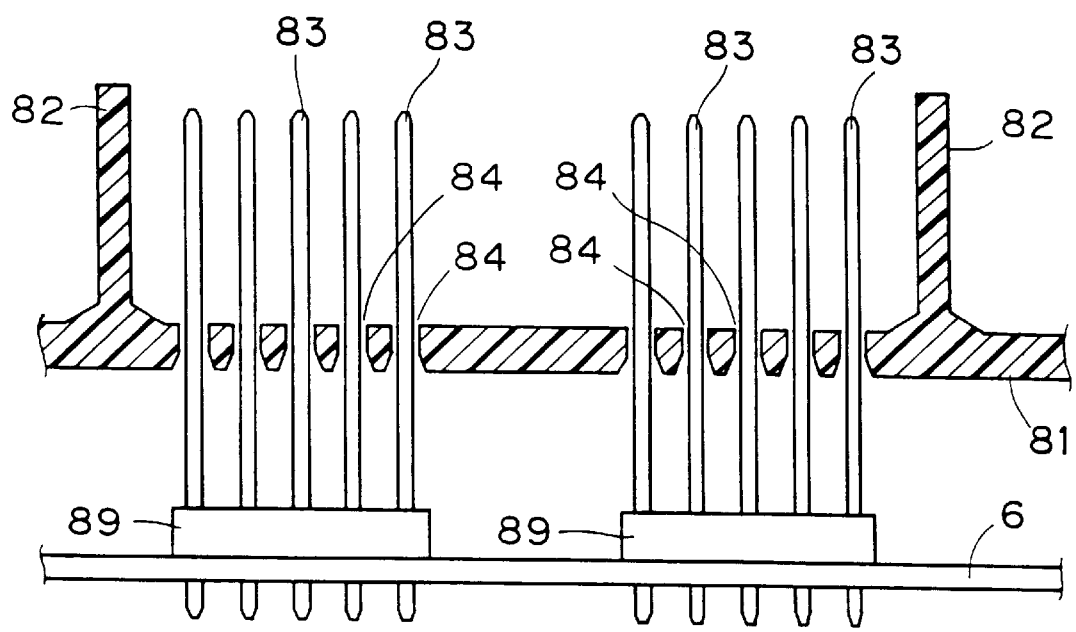

FIG. 14 is a fragmentary sectional view of the conventional device.

DESCRIPTION OF THE PREFERRED EMBODIMENTS

<1. First Preferred Embodiment>

First, a semiconductor device according to a first preferred embodiment will be described.

<1-1. Structure of Device>

Figure 2:
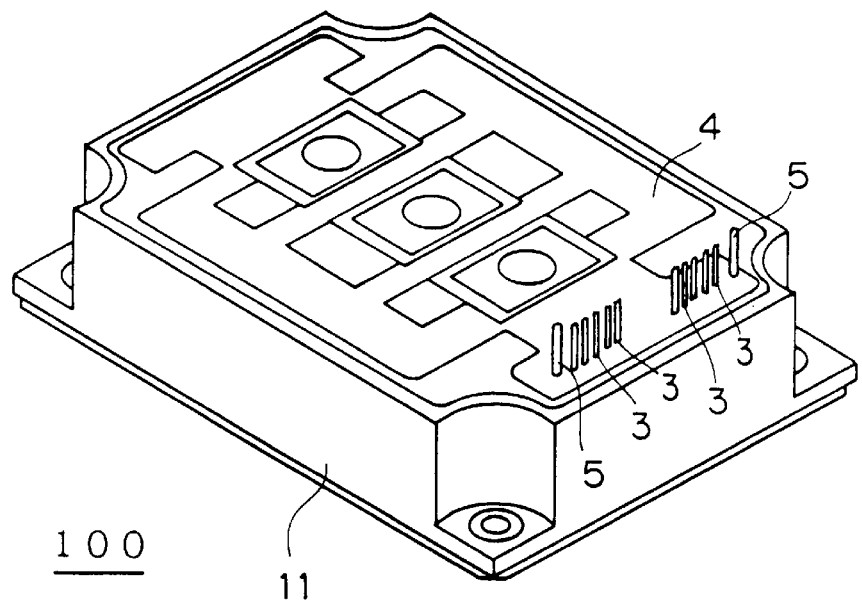
FIG. 2 is a perspective view of the device of the first preferred embodiment.

FIG. 2 is a perspective view showing the appearance of a semiconductor device of this preferred embodiment. Note that the same reference numerals indicate the same parts in the conventional device shown in FIG. 12 through FIG. 14 and a detailed description thereof is not repeated here. This semiconductor device 100, similarly to the conventional device shown in FIG. 12, includes a box-like case 11 having an opening at its upper end and a lid 4 in the form of a flat plate covering the opening. The lid 4 is preferably formed of the PBT resin similarly to the lid 81 of the conventional device. On the surface of the lid 4, ends of a plurality (ten in the example of FIG. 2) of signal pins 3 and two guide pins 5 project outside in parallel to one another. The two guide pins 5 are located on both sides of the signal pins 3 arranged in a row.

Figure 1:
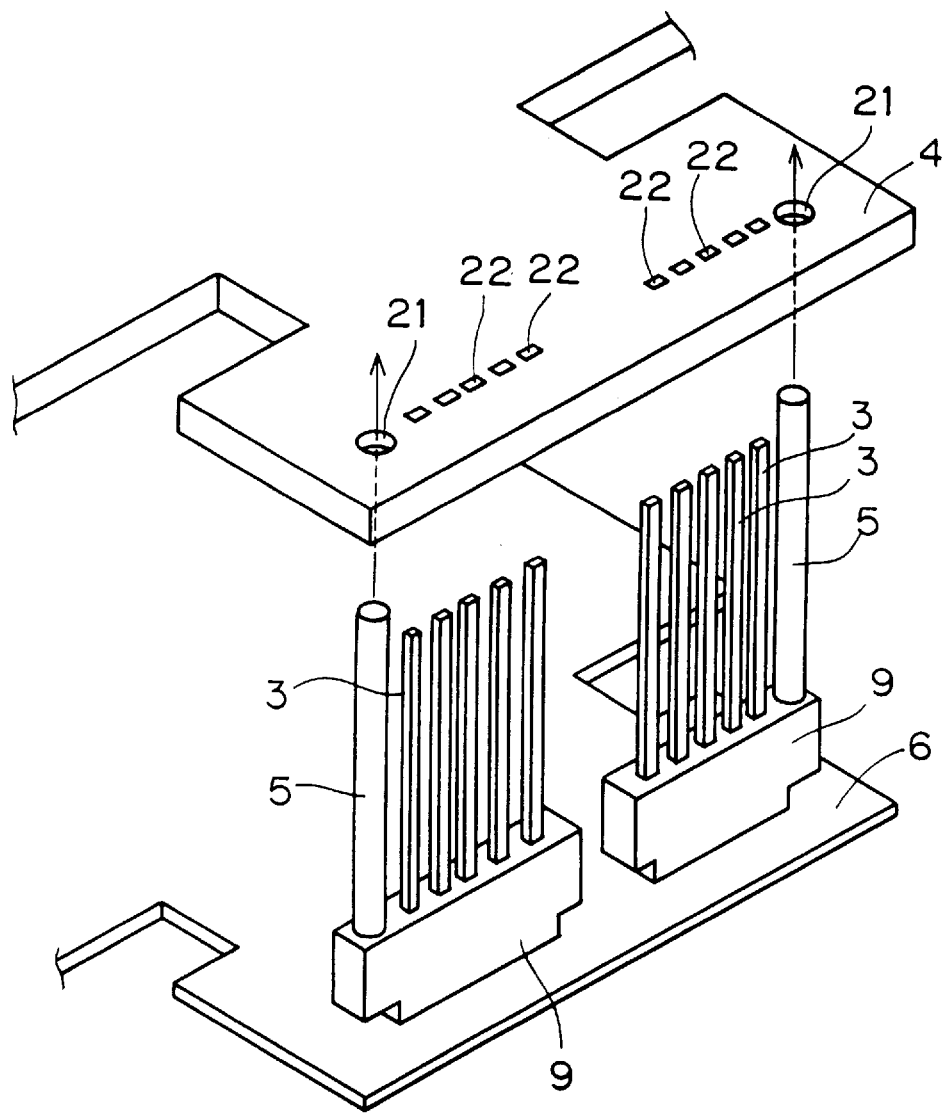
FIG. 1 is an exploded perspective view of a device of a first preferred embodiment.
Figure 3:
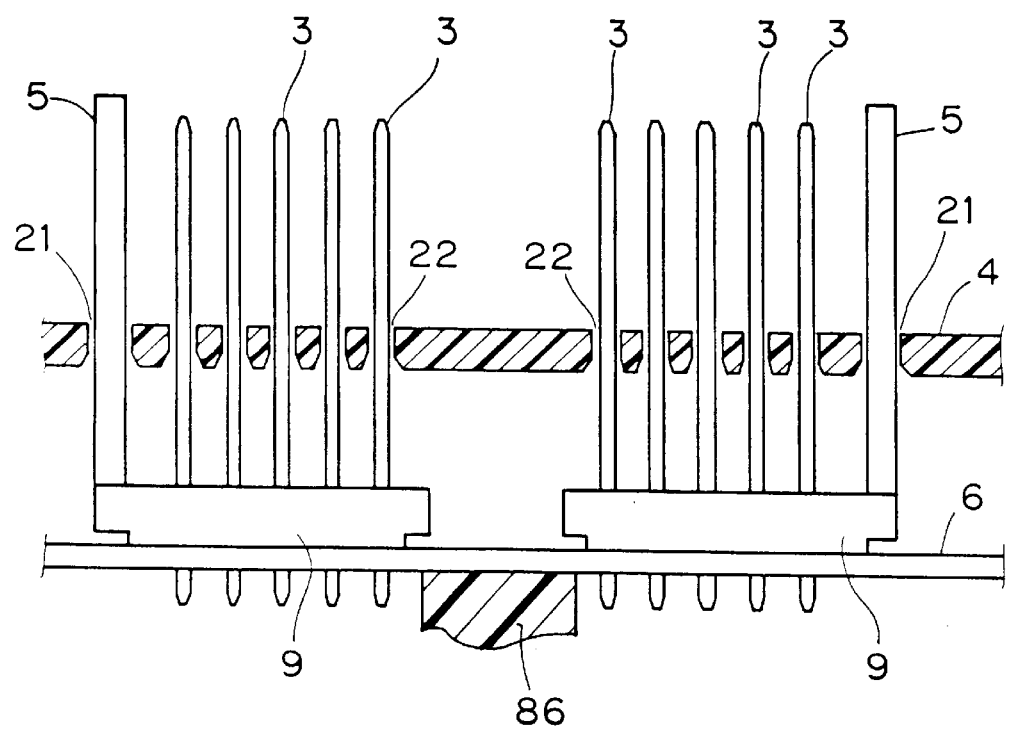
FIG. 3 is a fragmentary sectional view of the device of the first preferred embodiment.

FIG. 1 and FIG. 3 are an exploded fragmentary perspective view and a fragmentary sectional view showing the interior of the device 100, respectively. Similarly to the conventional device shown in FIG. 13, the lid 4 covers the opening of the case 11 to form an accommodation room inside. Then, the circuit board 6 accommodated in this accommodation room is fixed to the boss 86 provided on the bottom of the case 11 with screws, in the same manner as the conventional device.

The circuit board 6 is equipped with ten signal pins 3 projecting vertically from its main surface on the opposite side to the main surface facing the bottom of the case 11 (the lower surface), i.e., from its upper surface. The ten signal pins 3 are fixed to outsert cases (bases) 9, each five being fixed to each outsert case 9. The signal pins 3 are formed of metal with good electrical conductivity, and the outsert cases 9 fixing them together are formed of an electrically insulating resin. The guide pins 5 are also fixed to the outsert cases 9 as well as the signal pins 3.

The lid 4 has two holes (first through holes) 21 which the guide pins 5 can be passed though and ten holes (second through holes) 22 which the signal pins 3 can be passed through. These holes 22 and holes 21 are arranged in a row at predetermined positions at certain intervals, corresponding to the arrangement of the signal pins 3 and the guide pins 5. The lid 4 is fixed on the upper end of the case 11, with the signal pins 3 inserted in the holes 22 and the guide pins 5 inserted in the holes 21.

The guide pins 5 project longer than the signal pins 3. Accordingly, when fixing the lid 4 on the upper end of the case 11, the two guide pins 5 are inserted into the two holes 21 first. As a result, the tips of the ten signal pins 3 are guided respectively into the ten holes 21 and insertion of the signal pins 3 into the holes 22 can then be made easily. That is to say, the guide pins 5 also serve as a guiding member for guiding the signal pins 3 into the holes 22 in the lid 4. This increases the workability in the process of manufacturing the device 100 and saves labor and cost required in the production.

Particularly, two outsert cases 9 are prepared, each for fixing five signal pins 3 and one guide pin 5, and these two outsert cases 9 are attached to the circuit board 6 so that the ten signal pins 3 are disposed in a row and the two guide pins 5 are positioned on both sides of the row of signal pins 3. Accordingly, inserting the guide pins 5 into the holes 21 allows accurate positioning between the signal pins 3 and the holes 22.

To further enhance the workability, it is preferred to provide appropriate play (gap) between the holes 22 and the signal pins 3 passing therethrough, and between the holes 21 and the guide pins 5 passing therethrough. It is especially preferable that the play between the hole 22 and the signal pin 3 is set larger than the play between the hole 21 and the guide pin 5. Then, the signal pins 3 guided by the guide pins 5 and the holes 21 can be passed through the holes 22 certainly and smoothly without abutting on the rims of the holes 22.

<1-2. Outsert Case>

FIGS. 4A, 4B, and 4C include views showing three sides of the integrally united outsert case 9 and guide pin 5. FIG. 4(A) is a front sectional view, FIG. 4(B) is a side view and FIG. 4(C) is a plan view. The sectional view of FIG. 4(A) is taken along the line A—A in FIG. 4(C).

As shown in FIGS. 4A to 4C, the outsert case 9 is provided with five holes 25 placed in a row for insertion of the signal pins 3. These holes 25 are formed direction perpendicular to the flat bottom of the outsert case 9 (the plane facing the circuit board 6 when the outsert case 9 is mounted on the circuit board 6). The guide pin 5 is provided on the top surface of the outsert case 9 (the surface on the side opposite to the bottom) in a standing manner and is integrally coupled to the outsert case 9.

As the guide pin 5 and the outsert case 9 are integrally united, the guide pin 5 and the outsert case 9 can be formed simultaneously using a single mold. That is to say, it is advantageous in that the production of the guide pin 5 and the outsert case 9 is easy.

The position in which the guide pin 5 is formed in a standing manner is set at one end of the holes 25 arranged in a row. That is to say, the holes 25 are placed in a row together with the guide pin 5, with the guide pin 5 positioned at the end of the row. The guide pin 5 is also formed perpendicular to the bottom of the outsert case 9.

The guide pin 5 is preferably formed of a material having excellent toughness, such as polycarbonate. Then, the guide pin 5 can be prevented from being broken easily by an impact, such as a careless transverse force. The outsert case 9 which is integrally united with the guide pin 5 is also formed of the same material as the guide pin 5. The polycarbonate, having the electrically insulating property as well as large toughness, is suitable for a material for the guide pin 5 and the outsert case 9.

It is preferred that the toughness of the guide pin 5 has absolute magnitude which will enough to absorb the impact, such as a transverse force exerted by a man's mistake when assembling or using the device. However, the guide pin 5 having toughness which is high at least in comparison with the lid 4 and the case 11 required only to have relatively low strength against the impact will prevent accidents of breaking the guide pin 5 without unnecessarily increasing the cost required for the lid 4 and the case 11.

FIG. 5 is an enlarged sectional view showing the connection between the signal pins 3 and the circuit board 6. As shown in FIG. 5, the signal pins 3 are inserted into the holes 25 provided in the outsert case 9 to be fixedly supported by the outsert case 9. The signal pin 3 has a swelling portion 3b in the vicinity of its fixed end 3a (the end on the side opposite to the tip protruding outside of the device 100), and the swelling portion 3b is pressed into the hole 25. This prevents the signal pin 3 from getting off from the outsert case 9.

The fixed ends 3a of the signal pins 3 project from the bottom of the outsert case 9. The fixed ends 3a are fixed into the through holes 27 of the circuit board 6 with solder 28, with the fixed ends 3a being inserted into the through holes 27 and the bottom of the outsert case 9 abutting on the main surface of the circuit board 6. Thus, the circuits developed on the circuit board 6 and the signal pins 3 are electrically coupled together through the through holes 27.

Further, since the bottom of the outsert case 9 abuts on the main surface of the circuit board 6, the signal pins 3 are necessarily fixed perpendicularly to the main surface of the circuit board 6. Similarly, the guide pins 5 are also perpendicular to the main surface of the circuit board 6. Further, since the guide pin 5 and the signal pins 3 are both fixed to the common outsert case 9, high accuracy is always ensured in intervals and parallelism among the signal pins 3 and the guide pin 5.

Also, as the respective signal pins 3 are inserted into the through holes 27 formed in the circuit board 6, positions of the signal pins 3 relative to the circuit board 6 is accurately determined. Accordingly, high accuracy is also ensured in intervals among signal pins, or guide pins 5, fixed to different outsert cases 9.

Further, because the guide pin 5 and the plurality of signal pins 3 are fixed to the outsert case 9 together, fixing the outsert case 9 to the circuit board 6 allows such a large number of parts to be fixed to the circuit board 6 at the same time. Furthermore, as has been stated above, only fixing the outsert cases 9 to the circuit board 6 naturally ensures high accuracy in positions and parallelism of these parts. That is, in this respect as well, it is advantageous in that the workability of the process of manufacturing the device is high and labor and cost required in manufacturing are saved.

<1-3. Coupling with Connected Body>

When using the semiconductor device 100, a connected body capable of electric connection with the signal pins 3 is prepared. FIG. 6 is a fragmentary sectional front view showing the device 100 and a connected body 60 which are connected to each other. In FIG. 6, the device 100 is depicted in front appearance and the connected body 60 is depicted in a front section.

As shown in FIG. 6, the connected body 60 has a circuit board 7, and two sockets 8 fixedly attached to the circuit board 7, for example. The circuit board 7 is provided with interconnection pattern (not shown). The sockets 8 are directly connected to the signal pins 3 to relay electric connection between the signal pins 3 and the interconnection pattern on the circuit board 7.

The circuit board 7 is provided with ten signal holes 30 through which the signal pins 3 can be passed and two guide holes 29 through which the guide pins 5 can be passed. These signal holes 30 and guide holes 29 are arranged in a row at predetermined positions and at predetermined intervals in correspondence with the arrangement of the signal pins 3 and the guide pins 5.

FIG. 7 is an enlarged view of the part shown by the character "B" in FIG. 6. Each socket 8 is provided with five holes 31, through which the signal pins 3 can pass. The interval between the holes 31 corresponds to the interval between the signal pins 3. The two sockets are attached at appropriate positions on the main surface of the circuit board 7 where the ten holes 31 in total correspond to the ten signal holes 30 in a one-to-one correspondence.

The ends of the signal pins 3 passing through the signal holes 30 further pass through the holes 31 when the connected body 60 and the device 100 are coupled together. A contact member 32 formed of metal with good electric conductivity is provided on the inner wall of the hole 31. The end of the signal pin 3 passing through the hole 31 comes in close contact with the contact member 32 to realize electric connection between the signal pin 3 and the contact member 32. The contact member 32 is electrically coupled to the interconnection pattern on the circuit board 7, and the signal pins 3 are electrically coupled to the interconnection pattern of the circuit board 7 through the contact members 32.

As has already been discussed, the guide pins 5 protrude longer than the signal pins 3. This enables the guide pins 5 to serve to guide the signal pins 3 into the signal holes 30 when coupling the device 100 to the connected body 60 in use of the device 100. That is to say, when coupling the device 100 and the connected body 60 together, the two guide pins 5 are inserted into the two guide holes 29 first. As a result, the ends of the ten signal pins 3 are respectively guided into the ten signal holes 30, facilitating insertion of the signal pins 3 into the signal holes 30.

Particularly, since the guide pins 5 are disposed on both sides of the signal pins 3 placed in a row, insertion of the guide pins 5 into the guide holes 29 allows accurate positioning between the signal pins 3 and the signal holes 30.

<1-4. Manufacturing Method>

Next, a method of manufacturing the device 100 will be described.

First, the case 11 shown in FIG. 2 or FIG. 12, the lid 4 shown in FIG. 1 or FIG. 2, the circuit board 6 shown in FIG. 1, and the outsert cases 9 with the guide pins 5 and the signal pins 3 fixed thereto shown in FIG. 1, FIG. 3 to FIG. 5 are prepared. Further, the holes 21 and the holes 22 as shown in FIG. 1 and FIG. 3 are formed in the lid 4.

Next, as shown in FIG. 5, the fixed ends 3a of the signal pins 3 are soldered to the through holes 27, with the bottom surfaces of the outsert cases 9 abutting on the upper surface of the circuit board 6, and thus the outsert cases 9 are fixed to the circuit board 6. In this process, the signal pins 3 and the guide pins 5 are both fixed to the circuit board 6.

Next, as shown in FIG. 3 or FIG. 13, the circuit board 6 is screwed to the boss 86. Next, as shown in FIG. 1, the lid 4 is lowered from above the circuit board 6. At this time, the ends of the guide pins 5 are inserted into the holes 21 first. This determines relative position between the lid 4 and the circuit board 6 so that the holes 22 are positioned right above the signal pins 3.

Further, the lid 4 is lowered, and then the signal pins 3 are inserted into the holes 22. As the guide pins 5 are inserted into the holes 21, the large number of signal pins 3 are easily guided into the holes 22. Next, as shown in FIG. 2, the lid 4 is attached to the case 11 so as to cover the opening of the case 11. In the processes above, the device 100 is completed.

<1-5. Modified Example>

Although the ten signal pins 3 and the two guide pins 5 are fixed to the two outsert cases 9 separately by halves in the device 100, the ten signal pins 3 and the two guide pins 5 may be fixed to a common single outsert case. In this case, all the signal pins 3 and guide pins 5 are fixed to the circuit board 6 at the same time only by fixing the single outsert case to the circuit board 6, and therefore the workability in the process of manufacturing the device is further enhanced. The outsert case will then have a form as if the two outsert cases 9 in the device 100 (FIG. 1 or FIG. 2) are integrally united, for example.

<2. Second Preferred Embodiment>

The guide pin 5 and the outsert case 9 are integrally united in the device 100 of the first preferred embodiment. Here, examples will be described where a guide pin and an outsert case prepared as individual members are combined fixedly. Separately preparing the guide pin and the outsert case enables the guide pin to be formed of a material with excellent toughness, such as polycarbonate, and the outsert case, which is not required to have such excellent toughness as the guide pin, to be formed of an electrically insulating resin at a low price, which has been used in the conventional device. This can provide cost reduction of materials.

FIG. 8 is a fragmentary sectional view showing an example where the guide pin and the outsert case are screwed together to be fixed to each other. A tapped hole 34 is formed at one end of the upper surface of an outsert case 33. A guide pin 35 has at its one end a screw portion 36, which is like a shaft with a threaded side surface. The screw portion 36 is screwed into the tapped hole 34 and the guide pin 35 and the outsert case 33 are thus fixedly coupled. The tapped hole 34 can determine position and direction as accurately as the holes through which the signal pins 3 pass. Accordingly, it is possible to have enough accuracy of position of the guide pin 35 and enough accuracy of parallelism relative to the signal pins 3.

Further, as shown in FIG. 8, a step surface is formed between the body of the guide pin 35 (a part of the guide pin 35 except the screw portion 36) and the screw portion 36 by making the diameter of the screw portion 36 smaller than the diameter of the body. The screw portion 36 is screwed into the tapped hole 34 so that the step surface abuts upon the upper surface of the outsert case 33. Then, the length of projection of the guide pin 35, i.e., the length from the main surface of the circuit board 6 to the tip of the guide pin 35 when the outsert case 33 is attached to the circuit board 6 is accurately determined.

FIG. 9 is a fragmentary sectional view showing an example in which a guide pin is fit in to an outsert case so as to fix the two to each other. An insert hole 39 is formed at one end on the upper surface of the outsert case 38. The guide pin 40 has at its one end an insert portion 41, which is a portion like a shaft having a diameter smaller than that of the body. The insert portion 41 is fit into the insert hole 39 and the guide pin 40 and the outsert case 38 are thus coupled fixedly. An adhesive agent may be penetrated between the insert portion 41 and the insert hole 39.

The insert hole 39 can determine position and direction as accurately as the holes through which the signal pins 3 pass. Accordingly it is possible to sufficiently increase the accuracy of position of the guide pin 40 and the accuracy of parallelism relative to the signal pins 3. The insert portion 41 is fit into the insert hole 39 so that the step surface between the body of the guide pin 40 and the insert portion 41 abuts on the upper surface of the outsert case 38. This accurately determines the length of projection of the guide pin 40.

FIG. 10 is a fragmentary sectional view showing another example in which a guide pin is fit in to an outsert case so as to fix the two together. In this example, an insert hole 44 parallel to the bottom of an outsert case 43 is formed in its one side. An insert portion 46 vertically protruding on the side of the shaft-like body of a guide pin 45 is formed at its one end. The insert portion 46 is inserted and fit into the insert hole 44 and the guide pin 45 and the outsert case 43 are fixedly coupled. An adhesive agent may be penetrated between the insert portion 46 and the insert hole 44.

The insert hole 44 can accurately determine position and direction. Accordingly, it can sufficiently increase the accuracy of the projection length of the guide pin 45 and the accuracy of parallelism relative to the signal pins 3. The insert portion 46 is inserted and fit into the insert hole 44 so that the body of the guide pin 45 and the side of the outsert case 43 abut on each other. Then, the position of the guide pin 45 can be accurately determined. Or, it can be inserted so that the end of the insert portion 46 abuts on the bottom of the insert hole 44. In this case, position of the guide pin 45 can be accurately determined as well.

<3. Third Preferred Embodiment>

In the first and second preferred embodiments, the signal pins 3 and the guide pins 5 are fixed to the circuit board 6 through the outsert cases. Here, an example of semiconductor device will be described in which the signal pins and guide pins are fixed directly to a circuit board without through an outsert case.

FIG. 11 is a sectional view showing a part of a circuit board of a device of this preferred embodiment. As shown in FIG. 11, signal pins 53 formed of metal with good electrical conductivity and a guide pin 55 preferably formed of resin with high toughness such as polycarbonate are directly fixed to a circuit board 56.

The circuit board 56 is a member corresponding to the circuit board 6 of the first preferred embodiment, and is accommodated in the accommodation room formed with the case 11 and the lid 4 shown in FIG. 2 in the same way as the circuit board 6. Functions of the signal pins 53 and the guide pins 55 are the same as the functions of the signal pins 3 and the guide pins 5 in the first preferred embodiment, respectively. For convenience, FIG. 1 shows only a portion corresponding to half of the ten signal pins 53 and the two guide pins 55 arranged as shown in FIG. 1.

Through holes 61 are formed in the circuit board 56, and the signal pins 53 are inserted into the through holes 61 and soldered. Thus, the signal pins 53 are fixed into the through holes 61 and also electrically connected.

The through holes 61 are placed in a row and, are perpendicular to the main surface of the circuit board 56. Accordingly, the signal pins 53 are placed in a row and fixed perpendicularly to the main surface of the circuit board 56.

The signal pins 53 have projections 54 at their fixed ends, which can not pass through the through holes 61. These projections 54 are caught on the rims of the through holes 61 and then the projecting lengths of the signal pins 53 become uniform.

The circuit board 56 is further provided with a hole 62 for accepting insertion of the guide pin 55 to support it in position corresponding to the end in the same row as the aligned through holes 61. This hole 62 is also formed in a direction perpendicular to the main surface of the circuit board 56 in the same manner as the through holes 61. Accordingly, the guide pin 55 inserted into the hole 62 is also fixed perpendicular to the main surface of the circuit board 56, similarly to the signal pins 53. As a result, good parallelism is obtained among the guide pin 55 and the signal pins 53.

The guide pin 55 is placed in a row together with the signal pins 53 and located at the end of them. Further, positions of attachment of the signal pins 53 and the guide pin 55 are determined by the positions of the through holes 61 and the hole 62. Accordingly, high accuracy to the same extent as the through holes 61 etc. can be obtained in the intervals among the signal pins 53 and the guide pin 55.

A stop member 57 like a flange which can not pass through the hole 62 is formed at the fixed end of the guide pin 55, and a swelling portion 58 capable of close contact with the hole 62 is formed in the vicinity thereof. The swelling portion 58 is pressed into the hole 62 and thus the guide pin 55 is fixed to the circuit board 56 with a sufficient close contact force. The stop member 57 is caught on the rim of the hole 62 and thus the projecting length of the guide pin 55 is accurately determined to a predetermined length.

It is preferred that the outside diameter of the signal pin 53 is similar to the inside diameter of the through hole 61 so that unnecessary play will not exist between the signal pin 53 and the through hole 61. Then, the signal pins 53 are fixed vertically with high accuracy with respect to the main surface of the circuit board 56, which further increases parallelism among the signal pins 53 and the parallelism among the signal pins 53 and the guide pin 55.

This preferred embodiment is suitable especially for the case where the circuit board 56 has a large thickness. This is due to the fact that the accuracy of directions of the signal pins 53 and the guide pins 55 increases more as the circuit board 56 becomes thicker.

When manufacturing the device of this preferred embodiment, in the manufacturing method of the first preferred embodiment, the process of preparing the outsert cases 9 is omitted, and a process of fixing the signal pins 53 and the guide pins 55 to the circuit board 56 as shown in FIG. 11 is performed instead of the process of fixing the outsert cases 9 to the circuit board 6. Other steps are the same as those in the manufacturing method of the first preferred embodiment.

To fix the signal pins 53 to the circuit board 56, first, the tips of the signal pins 53 are inserted into the through holes 61 from the lower surface of the circuit board 56. Then, as the signal pins 53 are inserted until the projections 54 are stopped at the rims of the through holes 61, soldering is applied between the through holes 61 and the signal pins 53.

To fix the guide pin 55 to the circuit board 56, the tip of the guide pin 55 is inserted into the hole 62 from the lower surface of the circuit board 56. Then, it is further inserted until the swelling portion 58 is pressed into the hole 62, and further, the stop member 57 is caught and stopped on the rim of the hole 62. Thus, the signal pins 53 and the guide pins 55 are fixed to the circuit board 56.

<4. Modified Examples>

(1.) In the preferred embodiments discussed above, the guide pin 5 (or 55) projects longer than the signal pin 3 (or 53). However, if the surfaces of the connected body 60 and the lid 4 are not flat and the rims of the holes for insertion of the guide pins (the holes 21, for example) protrude in a direction closer to the circuit board 6 (or 56) than the rims of the holes for insertion of the signal pins (the holes 22, for example), the projecting length of the guide pin may be set equal to or smaller than the projecting length of the signal pins. As long as the positional relation between projecting lengths and rims of holes is set so that the guide pins can be inserted into the guide pin holes before the signal pins reach the holes for them, the same effects as those of the device 100 of the first preferred embodiment can be obtained.

(2.) In the preferred embodiments above, the plurality of signal pins 3 (or 53) are placed in a row and the guide pins 5 (or 55) are disposed on both ends in the same row with the signal pins 3 (or 53) interposed therebetween. The accuracy of guiding the signal pins 3 to the holes 22 can thus be enhanced, for example.

However, the plurality of signal pins 3 may generally be arranged in a plurality of rows, for example, not in a row. Furthermore, they do not necessarily have to be arranged in the form of a row or rows. Generally, as long as two guide pins 5 (or 55) are disposed on both sides of a group of signal pins 3 (or 53) interposed therebetween, the accuracy of guiding can be increased in the same way.

Not a plurality, but a single signal pin 3 (or 53) may be provided. As long as two guide pins 5 (or 55) are disposed on both sides of the single signal pin 3 (or 53) interposed therebetween, the accuracy of guiding can be increased in the same way.

Furthermore, not two but three or more guide pins 5 (or 55) may be provided. The same effect can be obtained by disposing the three or more enclosing a group of signal pins 3 (or 53).

(3.) The plurality of guide pins 5 (or 55) do not necessarily have to be disposed so that the signal pin(s) 3 (or 53) is (are) interposed or enclosed. In this case, since the positional relation between the circuit board 6 and the connected body 60, for example, is determined by the plurality of guide pins 5 (or 55), the effect of guiding the signal pin(s) 3 (or 53) can be obtained.

While the invention has been described in detail, the foregoing description is in all aspects illustrative and not restrictive. It is understood that numerous other modifications and variations can be devised without departing from the scope of the invention.

I claim:

1. A semiconductor device with structure in which a plurality of guide pins and at least one electroconductive signal pin project to the outside in parallel to one another, comprising:

a case in the form of a box having an opening at one end;

a lid which covers said opening; and a circuit board fixed to said case and accommodated in an accommodation room formed inside with said case and said lid, said plurality of guide pins and said at least one signal pin being fixed to said circuit board and projecting to said outside, passing through said lid.

2. The semiconductor device according to claim 1, wherein said plurality of guide pins project to said outside longer than said at least one signal pin.

3. The semiconductor device according to claim 1, wherein said lid and said case are formed of electrically insulating resin, and said plurality of guide pins are formed of resin with toughness higher than that of any of said lid and said case and wherein said lid has first through holes of the same number as said plurality of guide pins with said plurality of guide pins individually passing through said first through holes.

4. The semiconductor device according to claim 1, wherein said lid has at least one second through hole of the same number as said at least one signal pin through which said at least one signal pin individually passes, and play of said second through hole with respect to said at least one signal pin is larger than play of said first through holes with respect to said plurality of guide pins.

5. The semiconductor device according to claim 1, further comprising, at least one electrically insulating base to which said plurality of guide pins are fixed and said at least one signal pin is planted, wherein at least a part of said plurality of guide pins are fixed to, and at least a part of said at least one signal pin is planted to each of said at least one base, and said at least one base is fixed to said circuit board.

6. The semiconductor device according to claim 1, wherein at least two of said plurality of guide pins are disposed on both sides of said at least one signal pin interposed therebetween.

7. The semiconductor device according to claim 1, wherein said plurality of guide pins are three or more in number and the three or more guide pins are positioned to enclose said at leas one signal pin.

8. The semiconductor device according to claim 1, wherein said circuit board has first through holes of the same number as said plurality of guide pins into which said plurality of guide pins are individually inserted and a second through hole of the same number as said at least one signal pin into which said at least one signal pin is individually inserted, said plurality of guide pin have first stop members which are incapable of passing through said first through holes formed on their one ends on the side opposite to the side projecting to said outside, said at least one signal pin has a second stop member which is incapable of passing through said second through hole formed on its one end on the side opposite to the side projecting to said outside, said plurality of guide pins are fixedly supported in said first through holes with said first stop members abutting on rims of said first through holes, and said at least one signal pin is fixedly supported in said second through hole with said second stop member abutting on a rim of said second through hole.

9. The semiconductor device according to claim 5, wherein said base has a flat abutting plane and said base is fixed to said circuit board with said abutting plane abutting on a main surface of said circuit board.

10. The semiconductor device according to claim 5, wherein said plurality of guide pins and said at least one base are both formed of resin, and each of said at least one base is integrally united with said at least a part of said plurality of guide pins fixed to said each.

11. The semiconductor device according to claim 5, wherein said at least one base is formed of resin, and said plurality of guide pins are formed of resin having toughness higher than that of said at least one base.

\* \* \* \* \*